United States Patent
Xue et al.

(10) Patent No.: US 9,813,042 B2
(45) Date of Patent: Nov. 7, 2017

(54) CONVERTING A SINGLE-ENDED SIGNAL TO A DIFFERENTIAL SIGNAL

(71) Applicant: City University of Hong Kong, Kowloon (HK)

(72) Inventors: Quan Xue, New Territories (HK); Shaowei Liao, New Territories (HK)

(73) Assignee: CITY UNIVERSITY OF HONG KONG, Kowloon (HK)

(*) Notice: Subject to any disclaimer, the term of this patent is extended or adjusted under 35 U.S.C. 154(b) by 96 days.

(21) Appl. No.: 14/925,455

(22) Filed: Oct. 28, 2015

(65) Prior Publication Data
US 2017/0062896 A1 Mar. 2, 2017

(30) Foreign Application Priority Data
Aug. 28, 2015 (CN) .......................... 2015 1 0539809

(51) Int. Cl.
| | |
|---|---|
| H01P 5/103 | (2006.01) |
| H03H 7/42 | (2006.01) |
| H01P 5/08 | (2006.01) |
| H01P 3/12 | (2006.01) |
| H01P 5/10 | (2006.01) |

(52) U.S. Cl.
CPC ............... *H03H 7/42* (2013.01); *H01P 5/085* (2013.01); *H01P 5/103* (2013.01); *H01P 5/10* (2013.01)

(58) Field of Classification Search
CPC ............. H01P 5/103; H01P 5/107; H01P 3/12
USPC .......................................... 333/26, 239, 248
See application file for complete search history.

(56) References Cited

U.S. PATENT DOCUMENTS

| | | | |
|---|---|---|---|
| 3,678,418 A | 7/1972 | Woodward | |
| 4,882,553 A | 11/1989 | Davies et al. | |
| 6,137,376 A | 10/2000 | Imbornone et al. | |
| 6,498,540 B2 | 12/2002 | Deckman | |
| 7,403,085 B2 * | 7/2008 | Fukunaga | H01P 5/10 333/127 |
| 7,936,234 B2 | 5/2011 | Wu et al. | |
| 8,896,400 B1 * | 11/2014 | Harris | H01P 5/103 333/248 |

(Continued)

OTHER PUBLICATIONS

Sakian, et al. "Noise Figure and S-Parameter Measurement Setups for On-Wafer Differential 60GHz Circuits," Microwave Measurement Symposium (ARFTG), 2010 76th ARFTG, 4 pages.

(Continued)

*Primary Examiner* — Dean Takaoka
(74) *Attorney, Agent, or Firm* — Amin, Turocy & Watson, LLP

(57) ABSTRACT

A single-ended signal can be converted to a differential signal or reverse. A printed circuit board component can comprise a bottom metal layer and a top metal layer, wherein the bottom metal layer is connected to the top metal layer by an array of metal posts, and wherein the array of metal posts is arranged to form a substrate integrated waveguide network configured to transmit a set of electromagnetic waves corresponding to a single-ended signal represented according to a bandwidth. Furthermore, in an aspect, the device can comprise a coaxial to waveguide adaptor component comprising a coaxial cable port portion and a waveguide port portion, wherein the waveguide port portion guides the set of electromagnetic waves to the substrate integrated waveguide network.

21 Claims, 10 Drawing Sheets

(56) References Cited

U.S. PATENT DOCUMENTS

| | | | | |
|---|---|---|---|---|
| 9,059,498 B2* | 6/2015 | Huang | ............... | H01P 1/2088 |
| 9,509,034 B2* | 11/2016 | Xue | ............... | H01P 5/12 |
| 2004/0135647 A1 | 7/2004 | Cheung et al. | | |
| 2011/0001574 A1 | 1/2011 | Wu et al. | | |
| 2011/0181373 A1* | 7/2011 | Kildal | ............... | H01P 1/2005 |
| | | | | 333/239 |
| 2015/0333726 A1* | 11/2015 | Xue | ............... | H01P 3/121 |
| | | | | 333/26 |

OTHER PUBLICATIONS

Wu, et al., "A Wideband Microstrip Dual Balun Structure," IEEE MTT International Microwave Symposium (IMS), Tampa Bay, Florida, 2014, 3 pages.

Wu, et al. "A Novel Ka-Band Planar Balun Using Microstrip-CPS-Microstrip Transition", IEEE Microwave and Wireless Components Letters, vol. 21, No. 3, pp. 136-138, 2011, 3 pages.

Zhang, et al., "A Broadband Substrate Integrated Waveguide (SIW) Planar Balun," IEEE Microwave and Wireless Components Letters, vol. 17, No. 12, pp. 843-845, 2007, 3 pages.

* cited by examiner

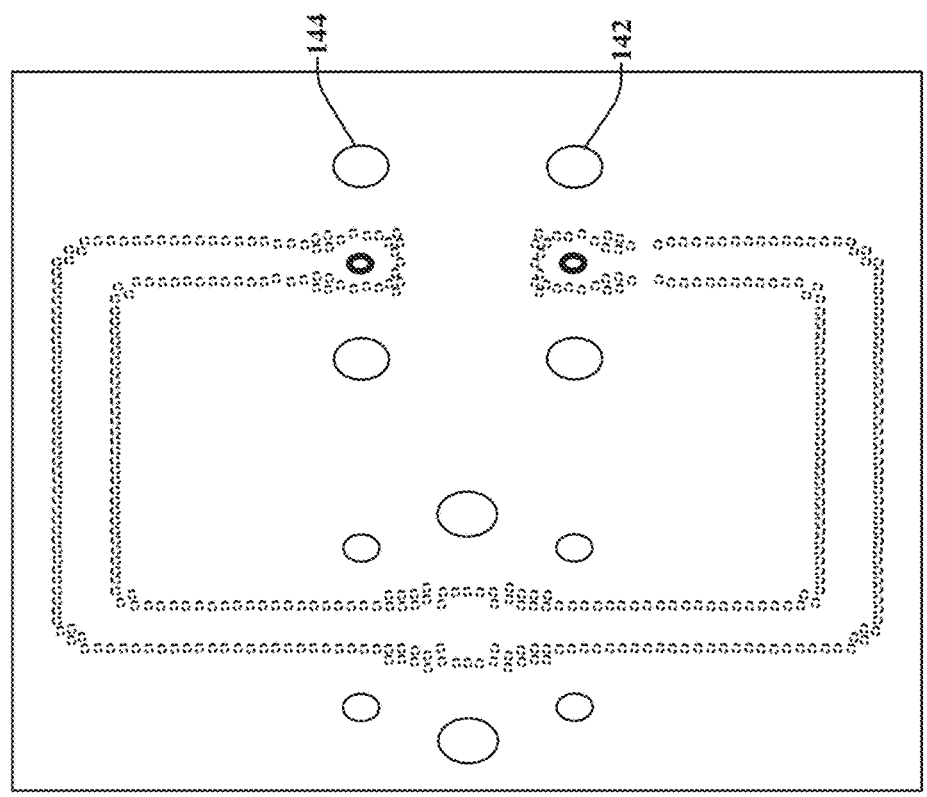
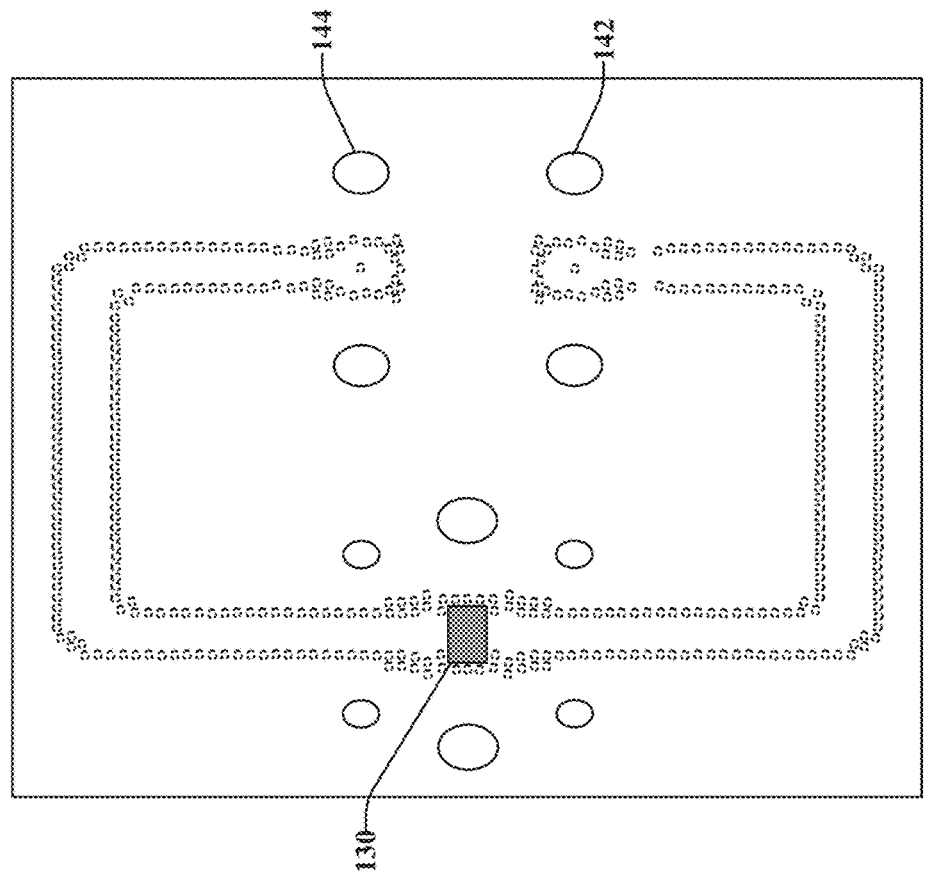

CONVERTING A SINGLE-ENDED SIGNAL TO A DIFFERENTIAL SIGNAL

PRIORITY CLAIM

This application claims priority to Chinese patent application number 201510539809.6, filed on Aug. 28, 2015. The entirety of the aforementioned application is incorporated by reference herein.

TECHNICAL FIELD

This disclosure generally relates to converting a single-ended signal to a differential signal using a high performance balun device.

BACKGROUND

Baluns are used in various microwave and millimeter wave systems to convert a balanced signal to an unbalanced signal or reverse. Conventionally, baluns utilized in such applications cause signal loss, phase imbalance, and amplitude imbalance during the conversion process. Furthermore, most baluns are bulky, expensive to assemble, and often generate a differential signal that fluctuates in signal quality. Also, such baluns are often cost prohibitive to use and assemble because they comprise customized components. Given these issues and problems associated with conventional baluns, there is a need for cheaper, efficacious, high quality and better performing baluns, especially at millimeter wave band.

The above-described background relating to balun systems, methods, and devices is merely intended to provide a contextual overview of some present conditions, and is not intended to be exhaustive. Other context regarding the state of the art may become further apparent upon review of the following detailed description.

SUMMARY

The following presents a simplified summary of various aspects of the disclosed subject matter in order to provide a basic understanding of some aspects described herein. This summary is not an extensive overview of the disclosed subject matter. It is intended to neither identify key or critical elements of the disclosed subject matter nor delineate the scope of such aspects. Its sole purpose is to present some concepts of the disclosed subject matter in a simplified form as a prelude to the more detailed description that is presented later.

In accordance with one or more embodiments and corresponding disclosure, various non-limiting aspects are described in connection with the development of a device to convert a single ended-signal to a differential signal. In an embodiment, a device is described. In an aspect, the device comprises a printed circuit board component that comprises a bottom metal layer and a top metal layer, wherein the bottom metal layer is connected to the top metal layer by an array of metal posts, and wherein the array of metal posts is arranged to form a substrate integrated waveguide network configured to transmit a set of electromagnetic waves corresponding to a single-ended signal represented according to a bandwidth.

In another aspect, the device employs a coaxial to waveguide adaptor component comprising a coaxial cable port portion and a waveguide port portion, wherein the waveguide port portion guides the set of electromagnetic waves to the substrate integrated waveguide network. In yet another aspect, the device employs a first coaxial terminal and a second coaxial terminal respectively, wherein the first coaxial terminal and the second coaxial terminal couple a first subset and a second subset of electromagnetic waves of the set of electromagnetic waves thereby generating a transformed set of electromagnetic waves.

In another embodiment, a method is described. The method comprises receiving a set of electromagnetic waves at a waveguide port portion of a coaxial to waveguide adaptor of a device. In an aspect, the method further comprises guiding the set of electromagnetic waves via a printed circuit board of the device, wherein the printed circuit board comprises a bottom metal layer connected to a bottom portion of an array of metal posts that form a substrate integrated network, and a top metal layer connected to a top portion of the array of metal posts. In another aspect, the method comprises transmitting the set of electromagnetic waves by the printed circuit board to a first surface mount coaxial terminal and a second surface mount coaxial terminal, wherein the first surface mount coaxial terminal and the second surface mount coaxial terminal are connected to a first metal post and a second metal post respectively of the array of metal posts. In yet another aspect, the method comprises emitting at least a subset of electromagnetic waves of the set of electromagnetic waves from the first surface mount coaxial terminal and the second surface mount coaxial terminal, wherein at least the subset of electromagnetic waves represents a differential signal corresponding to an impedance bandwidth.

The following description and annexed drawings set forth in detail certain illustrative aspects of the disclosed subject matter. These aspects are indicative, however, of but a few of the various ways in which the principles of the disclosed subject matter may be employed, and the disclosed subject matter is intended to include all such aspects and their equivalents. Other advantages and distinctive features of the disclosed subject matter will become apparent from the following detailed description of the disclosed subject matter when considered in conjunction with the drawings.

BRIEF DESCRIPTION OF THE DRAWINGS

Numerous aspects and embodiments are set forth in the following detailed description, taken in conjunction with the accompanying drawings, in which like reference characters refer to like parts throughout, and in which:

FIG. 4A is an example non-limiting illustration of a bottom metal layer of a PCB board component of a device for converting a single-ended signal to a differential signal or reverse.

FIG. 4B is an example non-limiting illustration of a top metal layer of a PCB board component of a device for converting a single-ended signal to a differential signal or reverse.

DETAILED DESCRIPTION

Figure 1:
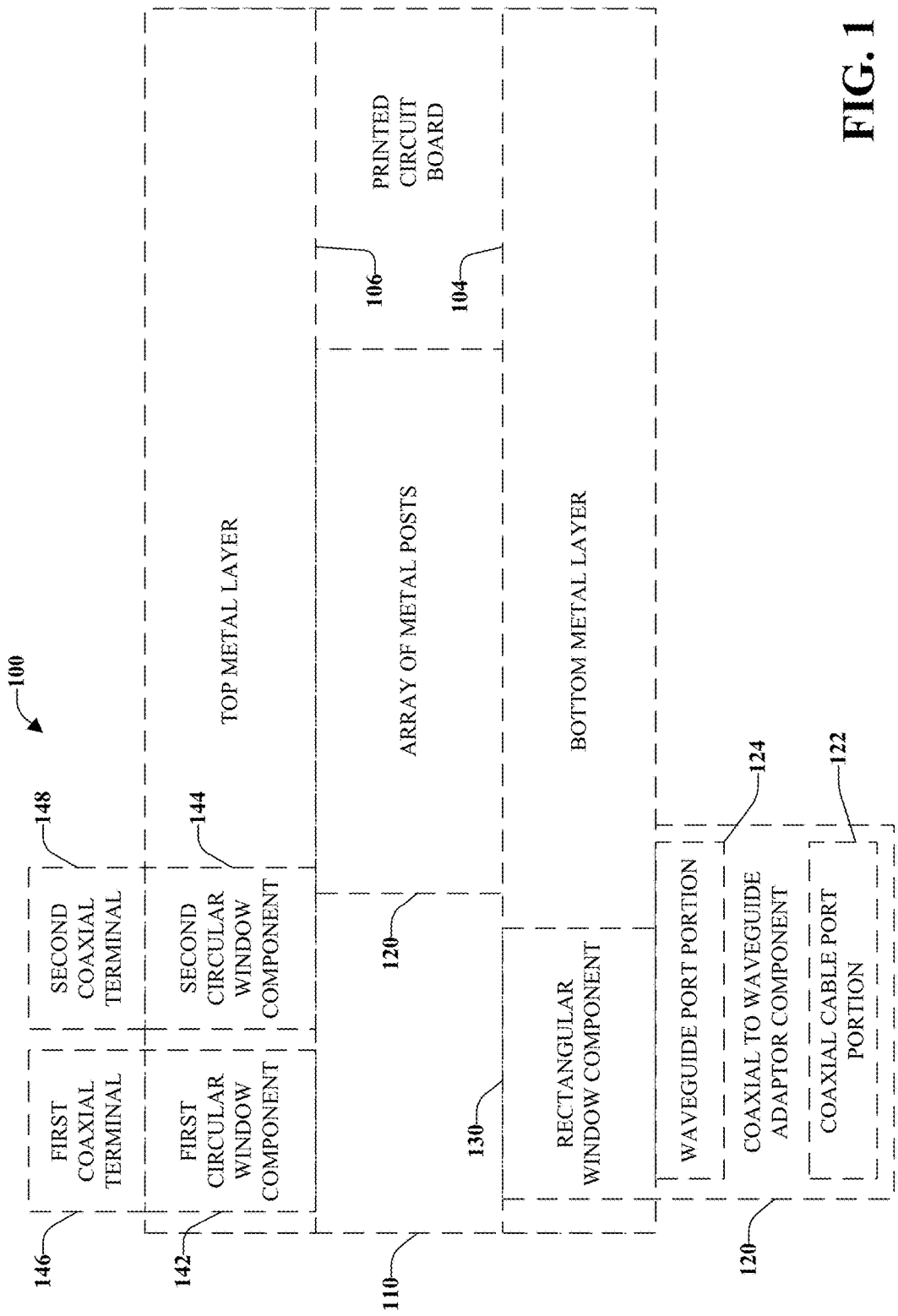
FIG. 1 is an example non-limiting block diagram of a device for converting a single-ended signal to a differential signal or reverse.

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that the certain aspects of disclosure may be practiced without these specific details, or with other methods, components, etc. In other instances, well-known structures and devices are shown in block diagram form to facilitate description and illustration of the various embodiments.

Overview

Baluns are used for various microwave or millimeter-wave applications for converting a single-end signal to a differential signal or reverse. In general, a millimeter wave band is characterized by having a very short wavelength and a balun transmits millimeter wave bands but are incapable of transmitting such wavebands at a high phase and high amplitude balance. Furthermore, baluns transmitting millimeter wave bands often transmit at the cost of high loss and producing a phase and amplitude imbalance. Even custom constructed baluns, present such problems and also tend to be bulky and expensive to produce. Thus, described herein is a high performing balun device that converts a single-ended signal to a differential signal or reverse. Furthermore, the disclosed balun has a unique structure, compact design, low production cost, and provides for a lower loss in bandwidth as compared to existing baluns.

In one or more embodiments of the subject application, a single-ended signal is converted to a differential signal. Referring now to the drawings, with reference initially to FIG. 1, illustrated is an example non-limiting schematic block diagram of a device 100. The device 100 comprises a printed circuit board component 110, a coaxial to waveguide adaptor component 120, a rectangular window component 130, a first circular window component 142, and a second circular window component 144. In an aspect, printed circuit board component 110 of device 100 comprises a bottom metal layer 104 and a top metal layer 106, wherein the bottom metal layer 104 is connected to the top metal layer 106 by an array of metal posts 120, and wherein the array of metal posts 120 is arranged to form a substrate integrated waveguide network (SIW) configured to transmit a set of electromagnetic waves corresponding to a single-ended signal represented according to a bandwidth.

In another aspect, coaxial to waveguide adaptor component 120 of device 100 comprises a coaxial cable port portion 122 and a waveguide port portion 124, wherein the waveguide port portion 124 guides the set of electromagnetic waves to the substrate integrated waveguide (SIW) network. Furthermore, in an aspect, a rectangular window component 130 located on the bottom metal layer 104 affixes to the coaxial to waveguide adaptor component 120. In yet another aspect, a first circular window component 142 and a second circular window component 144 located on the top layer encompass a first coaxial terminal 146 and a second coaxial terminal 148 respectively, wherein the first coaxial terminal 146 and the second coaxial terminal 148 couple a first subset and a second subset of electromagnetic waves of the set of electromagnetic waves thereby generating a transformed set of electromagnetic waves.

In an aspect, printed circuit board component 110 is a printed electronic component of device 100. Printed circuit board component 110 connects various electronic components and the printed circuit board component 110 comprises a bottom metal layer 104. On the bottom metal layer 104 is a rectangular window component 130 connected to coaxial to waveguide adaptor component 120. In an aspect, the coaxial to waveguide adaptor component 120 comprises a coaxial cable port portion 122 and a waveguide port portion 124. The waveguide port portion 124 can comprise an aperture or break in a waveguide through which the electromagnetic waves can pass. The port itself can be the bounded plane through which the electromagnetic waves pass and waveguide port portion 122 is capable of guiding waves to a substrate integrated waveguide (SIW) network.

In another aspect, coaxial to waveguide adaptor component 120 can include several other parts as well such as a waveguide tubing, waveguide flange, coaxial probe assembly, or modified coaxial adapter. In an aspect, waveguide port portion 124 can be a waveguide size of WR-15 and waveguide adaptor component 120 can comprise a 4 hole flange, a 50 Ohm coax connector impedance, a coax connector series (e.g., 1.85 mm), a coax connector gender (e.g., female), a waveguide adaptor style (e.g., right angle), a minimum frequency capability, a maximum frequency capability, and a voltage standing wave ratio (e.g., 1.5:1). Also, waveguide adaptor component 120 can comprise coaxial cable port portion 122, which is capable of connecting to a coaxial cable. As such coaxial waveguide adaptor 120 enables a transition between coaxial cables and waveguides (e.g., waveguides of various shapes).

In an aspect, coaxial to waveguide adaptor component 120 is connected to bottom metal layer 130 of printed circuit board component 110 via rectangular window component 130 located on bottom metal layer 130. As such coaxial to waveguide adaptor component 120 is connected to bottom metal layer 130 by several screws and screw caps. The printed circuit board 110 comprises bottom metal layer 104, top metal layer 106, and array of metal posts 120. In an aspect, array of metal posts 120 are arranged on the PCB board to form a Substrate Integrated Waveguide (SIW) network. An SIW is a structure of plated vias caged between two surfaces such as top metal layer 106 and bottom metal layer 104. An SIW is a transition between printed circuit board 110 and a coax to waveguide adaptor component 120.

The waveguide is converted to a SIW with the help of vias (e.g., array of metal posts 120), which act as sidewalls of the SIW.

In an aspect, a set of electromagnetic waves are guided through waveguide port portion 124 via coaxial to waveguide adaptor component 120. The set of electromagnetic waves are then transmitted through the SIW via printed circuit board 110. The SIW produces an electric field (E-field) and waveguide port portion 124 is parallel to the plane of the E-field produced by SIW. The E-field produced by SIW couples the set of electromagnetic waves in a manner by which a subset of the electromagnetic waves flowing from one arm of the SIW (e.g., a row of vias) and a subset of electromagnetic waves flowing from a second arm of the SIW (e.g., another row of vias) are coupled through the two arms of the SIW network such that the signals are out of phase with one another. Accordingly, a high quality differential signal can be acquired from the two arms of the SIW. In another aspect, located on top metal layer 106 of printed circuit board 110 are first circular window component 142 and second circular window component 144 and protruding through each circular window are first coaxial terminal 146 and second coaxial terminal 148 respectively. The SIW network couples the set of electromagnetic waves into a differential signal comprising out of phase subsets of electromagnetic waves and the differential signal is transmitted through first coaxial terminal 146 and second coaxial terminal 148.

In another aspect, device 100 can achieve a high performance signal matching by adjusting the geometric parameters of the components on printed circuit board 110. In an aspect, device 100 is different and provides significant advantages over existing baluns. The advantages of device 100 include a device having a simple structure, compact size, a low-cost of assembly, and a low signal loss.

As an example, while a conventional balun may comprise 3 WR-15 to coaxial adaptors, 7 sections of waveguides (e.g., straight and curved), and 1 Magic-T component, device 100 can comprise 1WR-15 to coaxial adaptor, 1 printed circuit board 110, and two surface mount coax connectors (APC1.85). Furthermore, a conventional balun can have the following performance characteristics such as a performance at 50-70 GHz (S11<−10), a loss in bandwidth of 2.2 dB, a phase imbalance in bandwidth of <8 degrees, an amplitude imbalance in bandwidth of <1 dB, a maximum size of 170 mm and an overall cost of 30,000 HKD. Alternatively, device 100 can have the following performance characteristics such as a performance at 57.5-65.4 GHz (S11<−15), a loss in bandwidth of 1.5 dB, a phase imbalance in bandwidth of <5 degrees, an amplitude imbalance of <0.2 dB, a maximum size of 45 mm, and an overall cost of less than 2,000 HKD. The advantages and increase in performance is clearly demonstrated by such comparison, such that the design, efficacy, and performance of device 100 contribute to the increased performance capability. Another advantage to device 100 is that unlike traditional baluns, which require many connections (e.g., 15 connections) between the components of a balun (e.g., waveguide's), which increase the reflection in the bandwidth, device 100 merely uses three connections, thus promoting high quality signal matching. Furthermore, in an aspect, the geometrical parameters of the balun can be configured to be changed or adjusted to provide achievement of a customized target bandwidth.

Figure 2B:
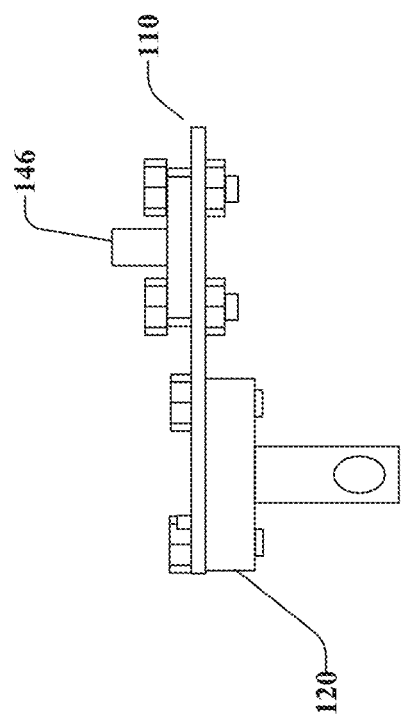
FIG. 2B is an example non-limiting side view illustrating the geometry of a device for converting a single-ended signal to a differential signal or reverse.
Figure 2A:
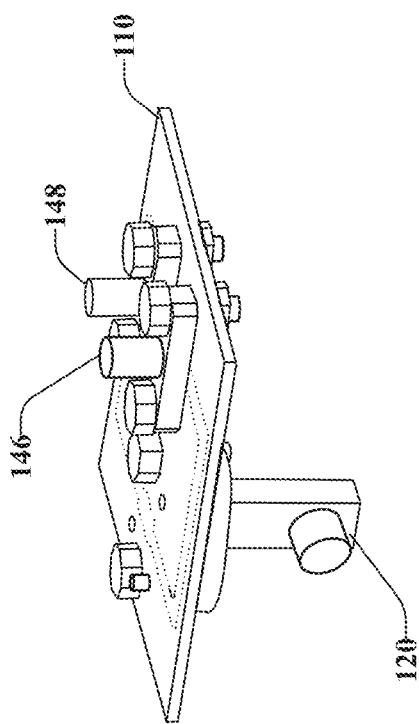
FIG. 2A is an example non-limiting perspective view illustrating the geometry of a device for converting a single-ended signal to a differential signal or reverse.

Turning now to FIG. 2A and FIG. 2B, illustrated are example non-limiting perspective views and side views of the geometric aspects of a device 100 for converting a single-ended signal to a differential signal or reverse. At FIG. 2A illustrated is coaxial to waveguide adaptor component 120 connected to printed circuit board 110. Furthermore, also illustrated are first coaxial terminal 146 and second coaxial terminal 148 connected to printed circuit board 110. At FIG. 2B the side view of geometric aspects of device 100 are illustrated. The side view illustrates coaxial to waveguide adaptor component 120 affixed to printed circuit board 110 by screws and screw caps. Also illustrated are first coaxial terminal 146 and second coaxial terminal 148 affixed to printed circuit board 110 by screws and screw caps.

Figure 3B:
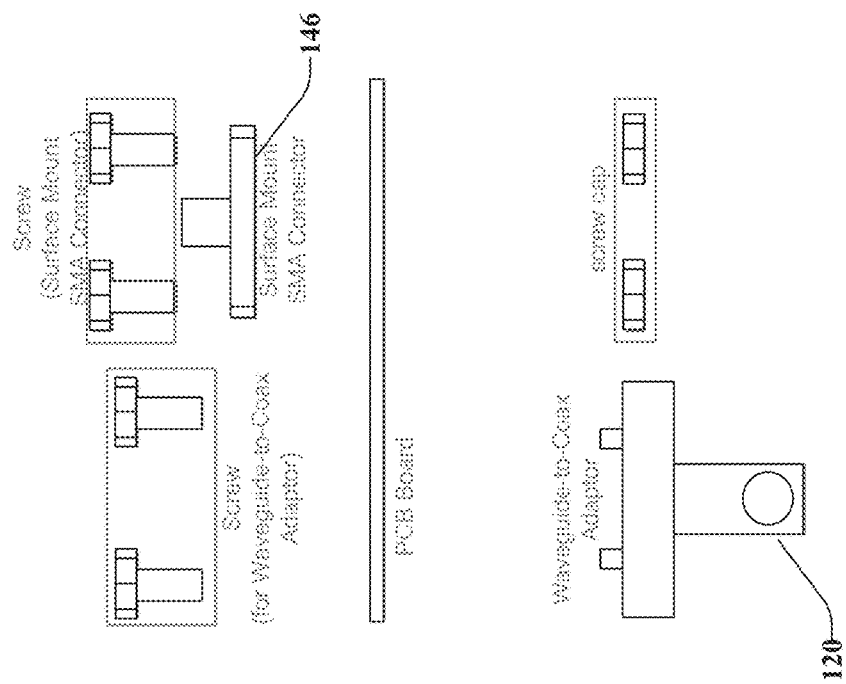
FIG. 3B is an example non-limiting size view illustrating a decomposed device for converting a single-ended signal to a differential signal or reverse.
Figure 3A:
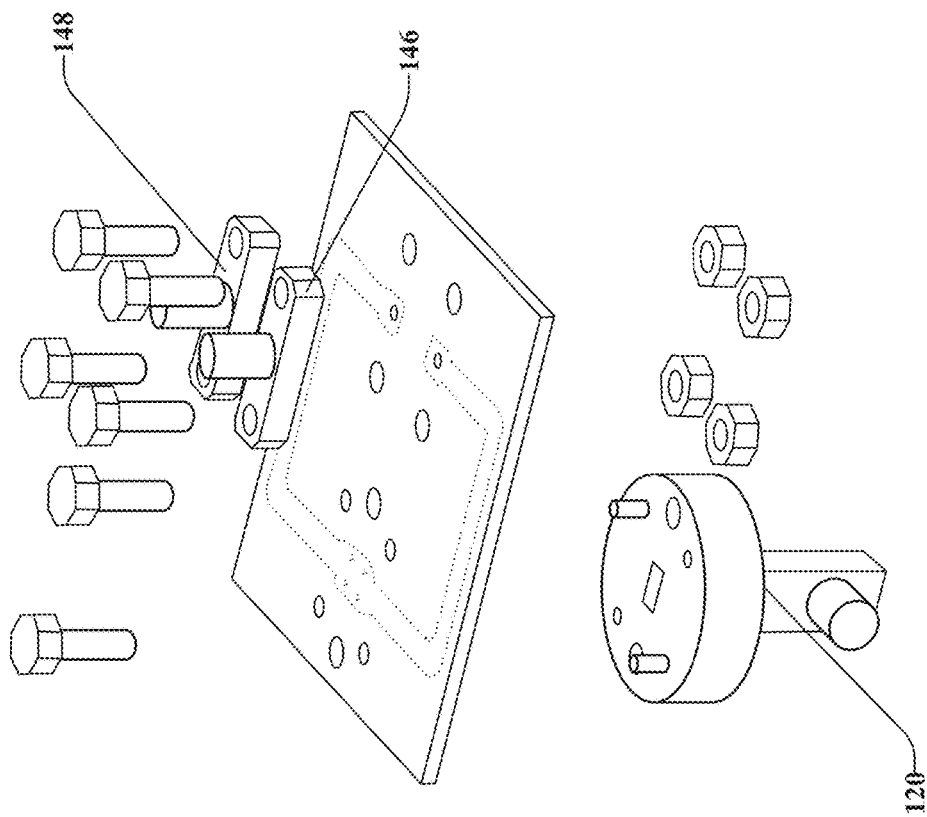
FIG. 3A is an example non-limiting side view illustrating a decomposed device for converting a single-ended signal to a differential signal or reverse.

Referring now to FIG. 3A and FIG. 3B, illustrated are example non-limiting perspective views and side views of the geometric aspects of device 100 for converting a single-ended signal to a differential signal or reverse. At FIG. 3A, illustrated are coaxial to waveguide adaptor component 120, printed circuit board 110, first coaxial terminal 146, second coaxial terminal 148, first circular window component 142, second circular window component 144, screws and screw caps to affix each respective component to printed circuit board 110. All such components are illustrated as decomposed parts to demonstrate how device 100 interconnects. At FIG. 3B illustrated are each component part from a side view including screws for coax to waveguide adaptor component 120 and coax to waveguide adaptor component 120. Also illustrated is first coaxial terminal 146 comprising a surface mount SMA connector surface mount screw connector, and a screw cap. Furthermore, in an aspect, illustrated is a side view of printed circuit board 110. The illustrated components, in part, come together to form device 100.

Turning now to FIG. 4A and FIG. 4B, illustrated are example non-limiting figures of bottom metal layer 104 (e.g., FIG. 4A) and top metal layer 106 (e.g., FIG. 4B) of printed circuit board 110. At FIG. 4A, bottom metal layer 104 provides rectangular window opening 130, which is capable of affixing to coax to waveguide adaptor component 120. Also illustrated are first circular window component 142 and second circular window component 144 capable of encircling first coaxial terminal 146 and second coaxial terminal 148. Printed circuit board 110 can comprise lines and pads that electrically connect various points and components together. In an aspect, printed circuit board 110 allows signals and power to route between the components of device 100. The components can be affixed to printed circuit board 110 by being soldered or mechanically adhered (e.g., being screwed onto the board). At FIG. 4B, illustrated is top metal layer 106 comprising first circular window component 142 and second circular window component 144, each of which are part of both top metal layer 106 and bottom metal layer 104. Also illustrated are various holes that allow screws to pass through in order to facilitate affixing of components to printed circuit board 110.

Figure 5:
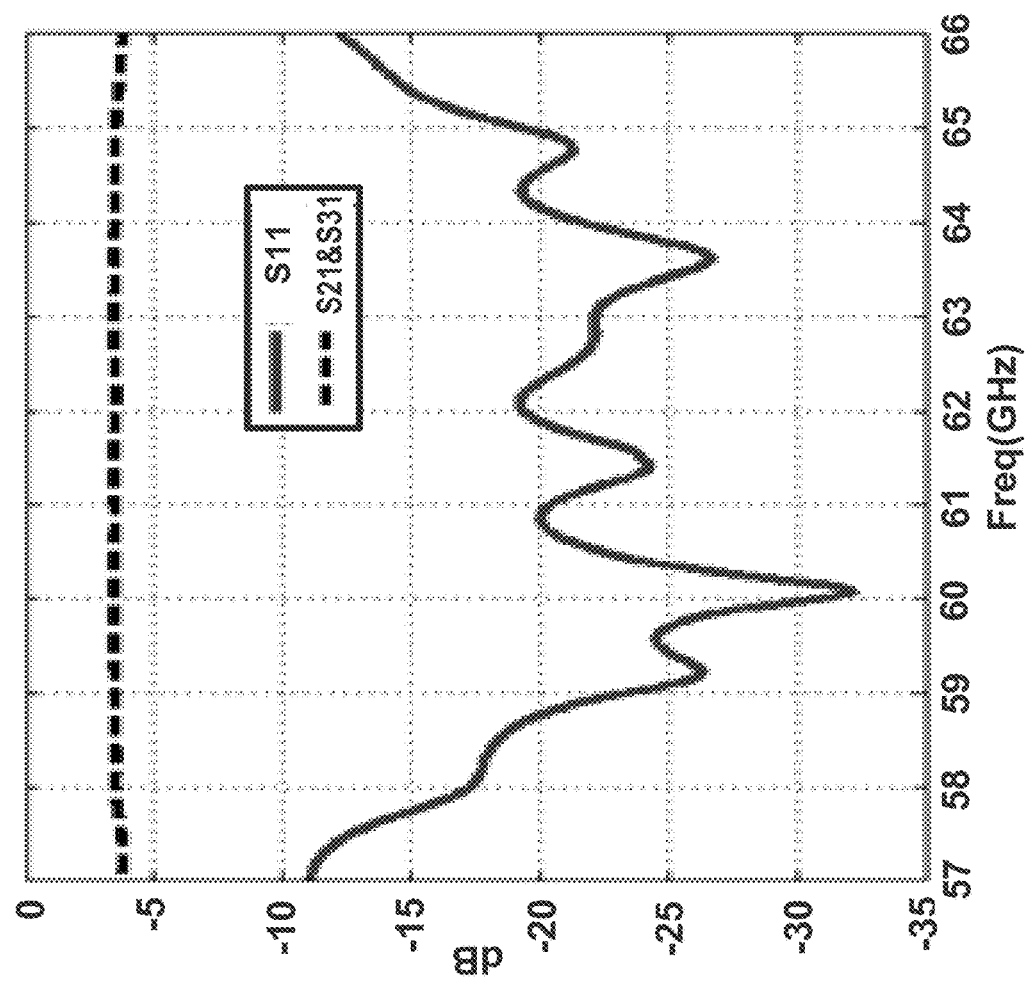
FIG. 5 is an example non-limiting chart illustrating the measured results of impedance bandwidth at respective reflection coefficients using a device for converting a single-ended signal to a differential signal or reverse.

Turning now to FIG. 5, illustrated is a chart that depicts non-limiting measured results using device 100. The impedance bandwidth for a reflection coefficient less than −15 dB is from 57.7 GHz to 65.4 GHz. Within the impedance bandwidth, the insert loss is less than −1.5 dB, the amplitude and phase imbalance are less than −0.2 and 5 degrees respectively. At FIG. 5, the S-parameters of device 100 are charted as a function of a y-axis with units in dB's and an x-axis with frequency units in GHz. The solid line illustrates S-parameters of S11 and the dotted line illustrates S-parameters of S21 & S31.

FIGS. 6-10 illustrate methods and/or flow diagrams in accordance with embodiments of this disclosure. For simplicity of explanation, the methods are depicted and described as a series of acts. However, acts in accordance with this disclosure can occur in various orders and/or concurrently, and with other acts not presented and described in this disclosure. Furthermore, not all illustrated acts may be required to implement the methods in accordance with the disclosed subject matter.

Figure 6:
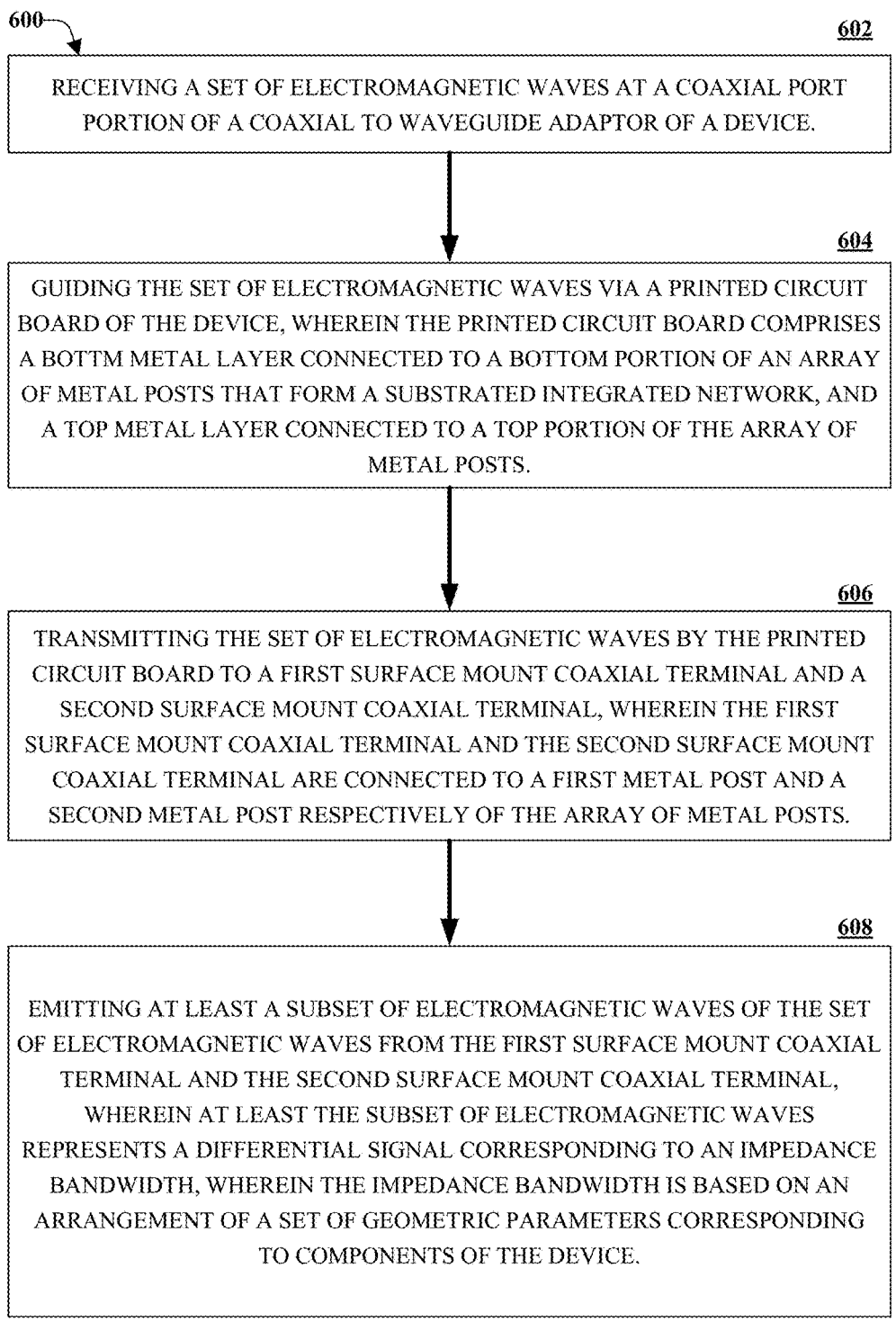
FIG. 6 is an example non-limiting process flow diagram of a method for converting a single-ended signal to a differential signal or reverse.

Referring now to FIG. 6, illustrated is an example non-limiting process flow diagram of a method 600 for converting a single-ended signal to a differential signal. At 602, a set of electromagnetic waves are received by a coaxial port portion (e.g., using coaxial port portion 122) of a coaxial to waveguide adaptor (e.g., using coaxial to waveguide adaptor component 120). At 604, the set of electromagnetic waves are guided using a printed circuit board (e.g., using printed circuit board 110), wherein the printed circuit board comprises a bottom metal layer (e.g., using bottom metal layer 104) connected to a bottom portion of an array of metal posts (e.g., using array of metal posts 120) that form a substrate integrated network (SIW), and a top metal layer (e.g., using top metal layer 106) connected to a top portion of the array of metal posts.

At 606, the set of electromagnetic waves are transmitted by the printed circuit board (e.g., using printed circuit board 110) to a first surface mount coaxial terminal (e.g., using first coaxial terminal 146) and a second surface mount coaxial terminal (e.g., using second coaxial terminal 148), wherein the first surface mount coaxial terminal and the second surface mount coaxial terminal are connected to a first metal post and a second metal post respectively of the array of metal posts. At 608, at least a subset of electromagnetic waves of the set of electromagnetic waves are emitted from the first surface mount coaxial terminal and the second surface mount coaxial terminal, wherein at least the subset of electromagnetic waves represents a differential signal corresponding to an impedance bandwidth, wherein the impedance bandwidth is based on an arrangement of a set of geometric parameters corresponding to components of the device.

Figure 7:
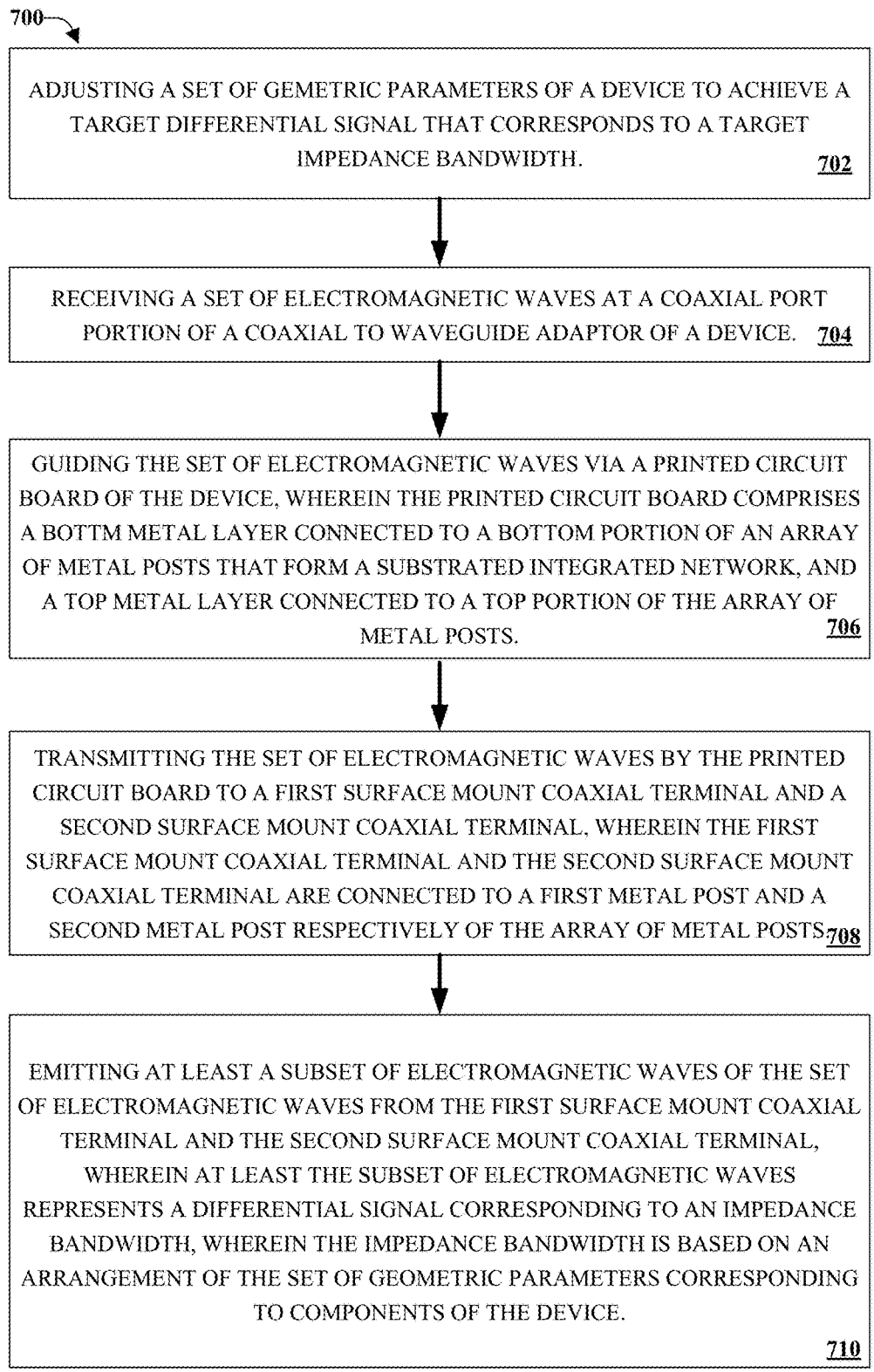
FIG. 7 is an example non-limiting process flow diagram of a method for converting a single-ended signal to a differential signal or reverse.

Referring now to FIG. 7, illustrated is an example non-limiting process flow diagram of a method 700 for converting a single-ended signal to a differential signal. At 702, a set of geometrical parameters of the device is adjusted to achieve a target differential signal that corresponds to a target impedance bandwidth. At element 704, a set of electromagnetic waves are received by a coaxial port portion (e.g., using coaxial port portion 122) of a coaxial to waveguide adaptor (e.g., using coaxial to waveguide adaptor component 120). At 706, the set of electromagnetic waves are guided using a printed circuit board (e.g., using printed circuit board 110), wherein the printed circuit board comprises a bottom metal layer (e.g., using bottom metal layer 104) connected to a bottom portion of an array of metal posts (e.g., using array of metal posts 120) that form a substrate integrated network (SIW), and a top metal layer (e.g., using top metal layer 106) connected to a top portion of the array of metal posts.

At 708, the set of electromagnetic waves are transmitted by the printed circuit board (e.g., using printed circuit board 110) to a first surface mount coaxial terminal (e.g., using first coaxial terminal 146) and a second surface mount coaxial terminal (e.g., using second coaxial terminal 148), wherein the first surface mount coaxial terminal and the second surface mount coaxial terminal are connected to a first metal post and a second metal post respectively of the array of metal posts. At 710, at least a subset of electromagnetic waves of the set of electromagnetic waves are emitted from the first surface mount coaxial terminal and the second surface mount coaxial terminal, wherein at least the subset of electromagnetic waves represents a differential signal corresponding to an impedance bandwidth, wherein the impedance bandwidth is based on an arrangement of a set of geometric parameters corresponding to components of the device.

Figure 8:
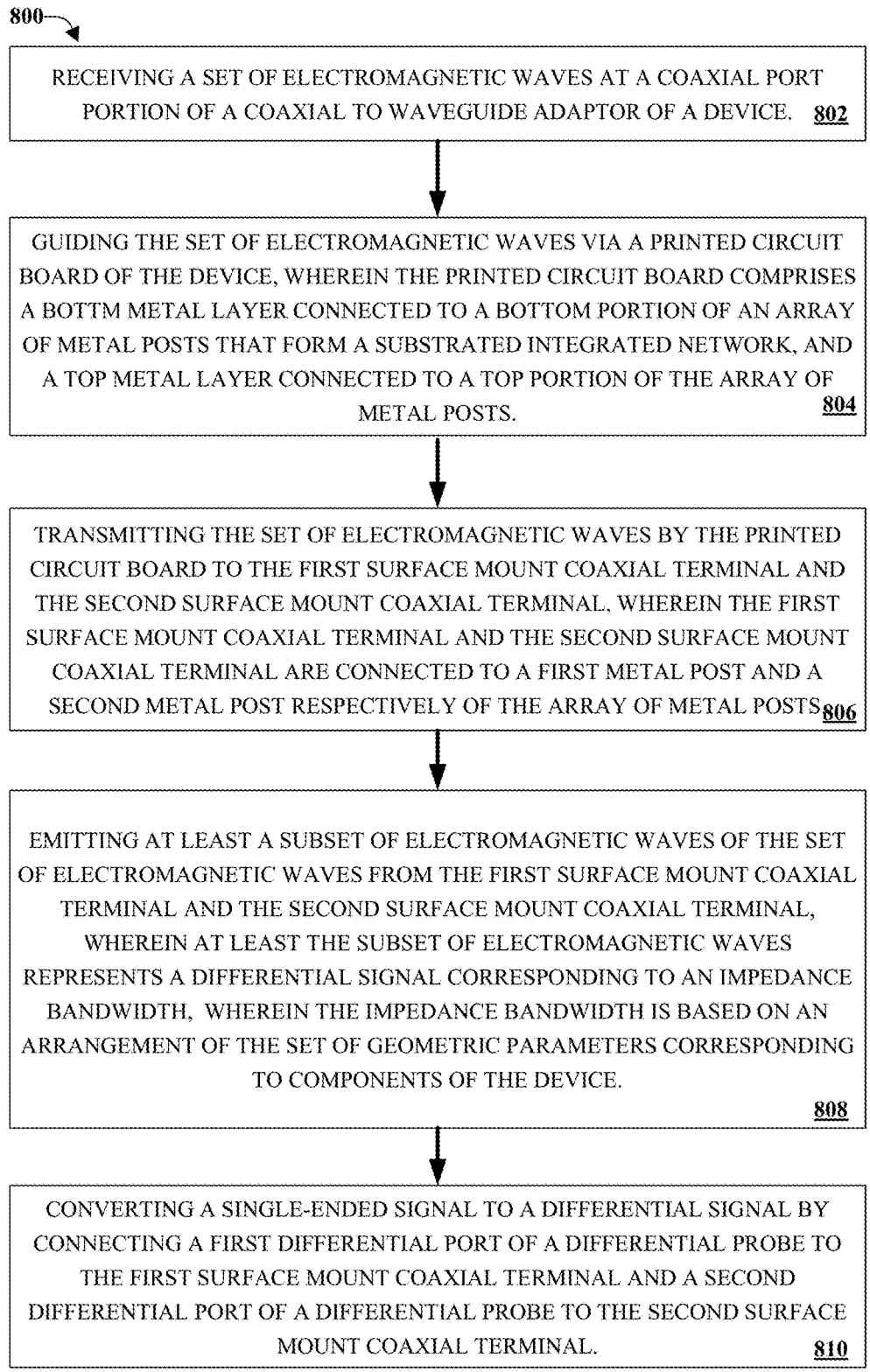
FIG. 8 is an example non-limiting process flow diagram of a method for converting a single-ended signal to a differential signal or reverse.

Referring now to FIG. 8, illustrated is an example non-limiting process flow diagram of a method 800 for converting a single-ended signal to a differential signal. At 802, a set of electromagnetic waves are received by a coaxial port portion (e.g., using coaxial port portion 122) of a coaxial to waveguide adaptor (e.g., using coaxial to waveguide adaptor component 120). At 804, the set of electromagnetic waves are guided using a printed circuit board (e.g., using printed circuit board 110), wherein the printed circuit board comprises a bottom metal layer (e.g., using bottom metal layer 104) connected to a bottom portion of an array of metal posts (e.g., using array of metal posts 120) that form a substrate integrated network (SIW), and a top metal layer (e.g., using top metal layer 106) connected to a top portion of the array of metal posts.

At 806, the set of electromagnetic waves are transmitted by the printed circuit board (e.g., using printed circuit board 110) to a first surface mount coaxial terminal (e.g., using first coaxial terminal 146) and a second surface mount coaxial terminal (e.g., using second coaxial terminal 148), wherein the first surface mount coaxial terminal and the second surface mount coaxial terminal are connected to a first metal post and a second metal post respectively of the array of metal posts. At 808, at least a subset of electromagnetic waves of the set of electromagnetic waves are emitted from the first surface mount coaxial terminal and the second surface mount coaxial terminal, wherein at least the subset of electromagnetic waves represents a differential signal corresponding to an impedance bandwidth, wherein the impedance bandwidth is based on an arrangement of a set of geometric parameters corresponding to components of the device. At 810, a single-ended signal is converted to a differential signal by connecting a first differential port of a differential probe to the first surface mount coaxial terminal and a second differential port of a differential probe to the second surface mount coaxial terminal.

Figure 9:
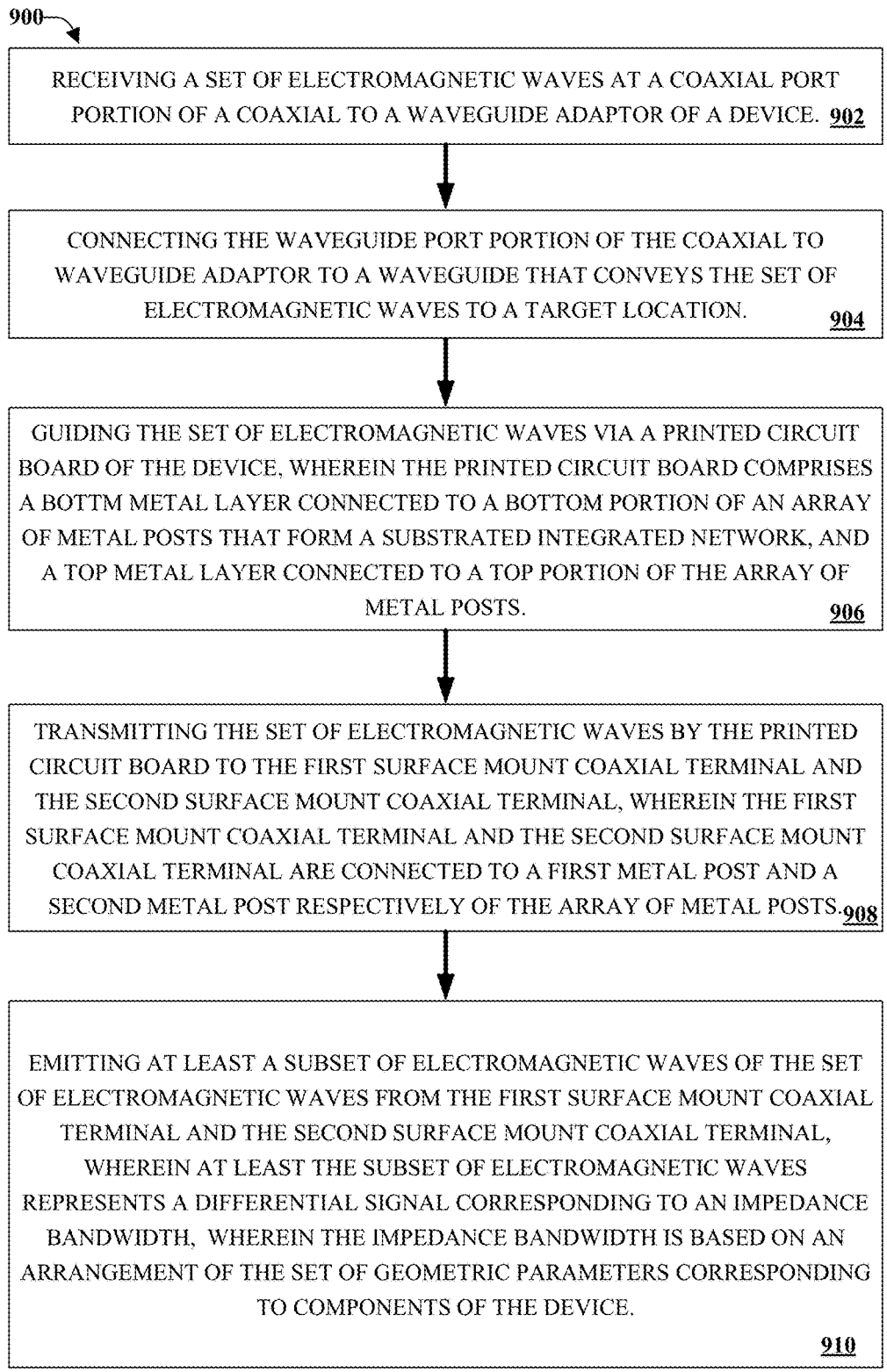
FIG. 9 is an example non-limiting process flow diagram of a method for converting a single-ended signal to a differential signal or reverse.

Referring now to FIG. 9, illustrated is an example non-limiting process flow diagram of a method 900 for converting a single-ended signal to a differential signal. At 902, a set of electromagnetic waves are received by a coaxial port portion (e.g., using coaxial port portion 122) of a coaxial to waveguide adaptor (e.g., using coaxial to waveguide adaptor component 120). At 904, the waveguide port portion of the coaxial to a waveguide adaptor is connected to a waveguide that conveys the set of electromagnetic waves to a target location. At 906, the set of electromagnetic waves are guided using a printed circuit board (e.g., using printed circuit board 110), wherein the printed circuit board comprises a bottom metal layer (e.g., using bottom metal layer 104) connected to a bottom portion of an array of metal posts (e.g., using array of metal posts 120) that form a substrate integrated network (SIW), and a top metal layer (e.g., using top metal layer 106) connected to a top portion of the array of metal posts.

At 908, the set of electromagnetic waves are transmitted by the printed circuit board (e.g., using printed circuit board 110) to a first surface mount coaxial terminal (e.g., using first coaxial terminal 146) and a second surface mount coaxial terminal (e.g., using second coaxial terminal 148), wherein the first surface mount coaxial terminal and the second surface mount coaxial terminal are connected to a first metal post and a second metal post respectively of the array of metal posts. At 910, at least a subset of electromagnetic waves of the set of electromagnetic waves are emitted from the first surface mount coaxial terminal and the second surface mount coaxial terminal, wherein at least the subset of electromagnetic waves represents a differential signal corresponding to an impedance bandwidth, wherein the impedance bandwidth is based on an arrangement of a set of geometric parameters corresponding to components of the device.

Figure 10:
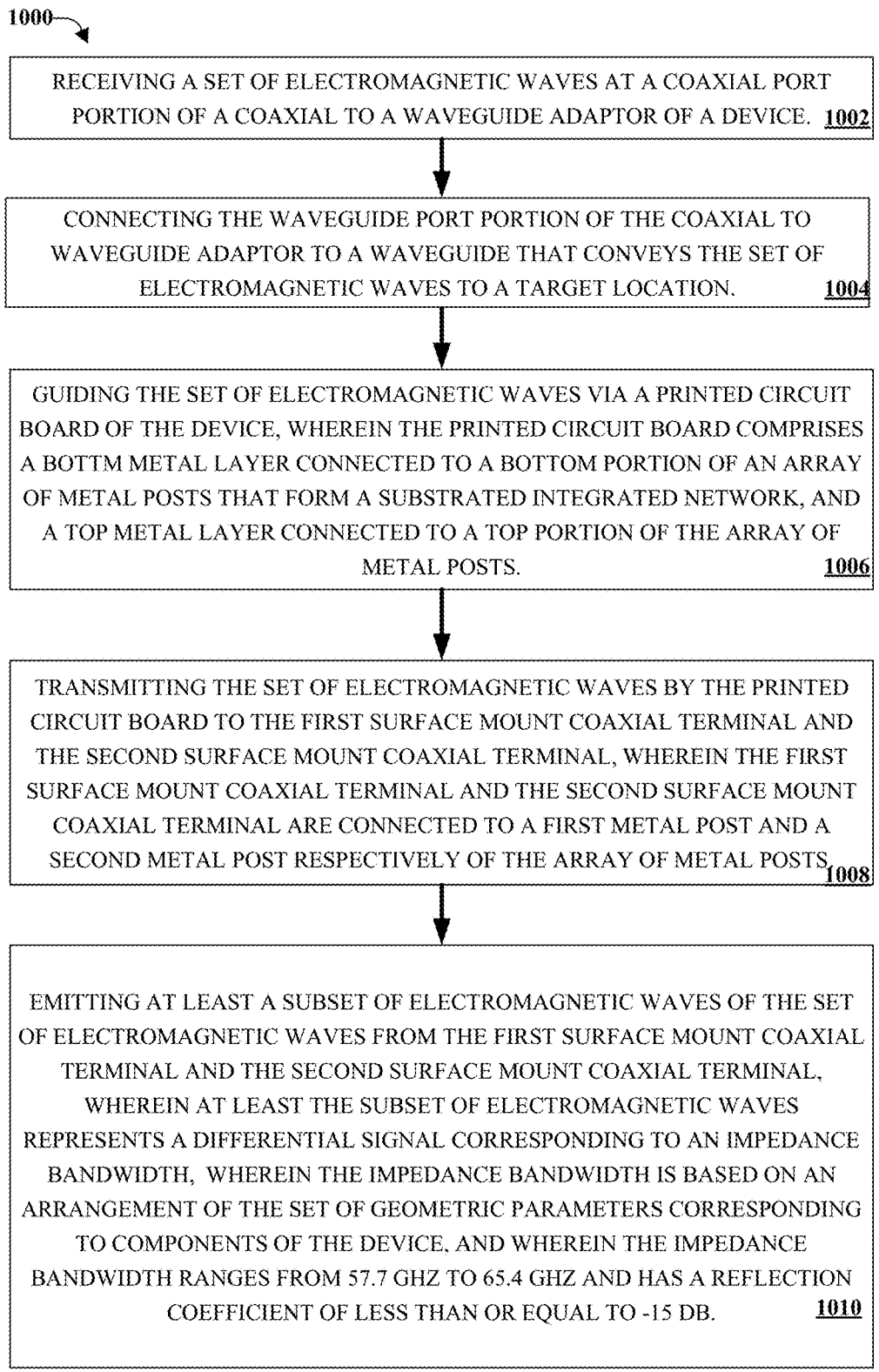
FIG. 10 is an example non-limiting process flow diagram of a method for converting a single-ended signal to a differential signal or reverse.

Referring now to FIG. 10, illustrated is an example non-limiting process flow diagram of a method 1000 for converting a single-ended signal to a differential signal. At 1002, a set of electromagnetic waves are received by a coaxial port portion (e.g., using coaxial port portion 122) of a coaxial to waveguide adaptor (e.g., using coaxial to waveguide adaptor component 120). At 1004, the waveguide port portion of the coaxial to waveguide adaptor is connected to a waveguide that conveys the set of electromagnetic waves to a target location. At 1006, the set of electromagnetic waves are guided using a printed circuit board (e.g., using printed circuit board 110), wherein the printed circuit board comprises a bottom metal layer (e.g., using bottom metal layer 104) connected to a bottom portion of an array of metal posts (e.g., using array of metal posts 120) that form a substrate integrated network (SIW), and a top metal layer (e.g., using top metal layer 106) connected to a top portion of the array of metal posts.

At 1008, the set of electromagnetic waves are transmitted by the printed circuit board (e.g., using printed circuit board 110) to a first surface mount coaxial terminal (e.g., using first coaxial terminal 146) and a second surface mount coaxial terminal (e.g., using second coaxial terminal 148), wherein the first surface mount coaxial terminal and the second surface mount coaxial terminal are connected to a first metal post and a second metal post respectively of the array of metal posts. At 1008, at least a subset of electromagnetic waves of the set of electromagnetic waves are emitted from the first surface mount coaxial terminal and the second surface mount coaxial terminal, wherein at least the subset of electromagnetic waves represents a differential signal corresponding to an impedance bandwidth, wherein the impedance bandwidth is based on an arrangement of a set of geometric parameters corresponding to components of the device, and wherein the impedance bandwidth ranges from 57.7 GHz to 65.4 GHz and has a reflection coefficient of less than or equal to −15 dB.

What has been described above includes examples of the embodiments of the subject disclosure. It is, of course, not possible to describe every conceivable combination of components or methods for purposes of describing the claimed subject matter, but it is to be appreciated that many further combinations and permutations of the various embodiments are possible. Accordingly, the claimed subject matter is intended to embrace all such alterations, modifications, and variations that fall within the spirit and scope of the appended claims. While specific embodiments and examples are described in this disclosure for illustrative purposes, various modifications are possible that are considered within the scope of such embodiments and examples, as those skilled in the relevant art can recognize.

In addition, the words "example" or "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, while an aspect may have been disclosed with respect to only one of several embodiments, such feature may be combined with one or more other features of the other embodiments as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements. Numerical data, such as temperatures, concentrations, times, ratios, and the like, are presented herein in a range format. The range format is used merely for convenience and brevity. The range format is meant to be interpreted flexibly to include not only the numerical values explicitly recited as the limits of the range, but also to include all the individual numerical values or sub-ranges encompassed within the range as if each numerical value and sub-range is explicitly recited. When reported herein, any numerical values are meant to implicitly include the term "about." Values resulting from experimental error that can occur when taking measurements are meant to be included in the numerical values.

What is claimed is:

1. A device, comprising:
 a printed circuit board component that comprises a bottom metal layer and a top metal layer, wherein the bottom metal layer is connected to the top metal layer by an array of metal posts, and wherein the array of metal posts is arranged to form a substrate integrated waveguide network configured to transmit a set of electromagnetic waves corresponding to a single-ended signal represented according to a bandwidth;
 a coaxial to waveguide adaptor component comprising a coaxial cable port portion and a waveguide port portion, wherein the waveguide port portion guides the set of electromagnetic waves to the substrate integrated waveguide network;
 a rectangular window component located on the bottom metal layer that affixes to the coaxial to waveguide adaptor component; and
 a first coaxial terminal and a second coaxial terminal that couple a first subset and a second subset of electromagnetic waves of the set of electromagnetic waves thereby generating a transformed set of electromagnetic waves corresponding to an impedance bandwidth based on geometric parameters of the device.

2. The device of claim 1, wherein the first distance between the first coaxial terminal and the second coaxial terminal is configured to be changed.

3. The device of claim 1, further comprising:
 a first circular window component and a second circular window component located on the top layer that encompass the first coaxial terminal and the second coaxial terminal respectively, wherein a second distance between the first circular window component and the second window component is configured to be changed.

4. The device of claim 1, wherein one or more of the geometric parameters of the device are adjusted to achieve the impedance bandwidth ranging from about 57.5 gigahertz to about 65.4 gigahertz.

5. The device of claim 4, wherein the impedance bandwidth corresponds to a reflection coefficient of less than about −15 dB.

6. The device of claim 1, wherein the waveguide portion receives or sends the single-ended signal.

7. The device of claim 6, wherein the single-ended signal is converted by the substrate waveguide integrated network into a differential signal or reverse.

8. The device of claim 1, wherein a size of the device is approximately 45 mm or less.

9. The device of claim 1, wherein an amplitude imbalance in bandwidth is less than about 0.2 dB.

10. A method, comprising:
receiving a set of electromagnetic waves at a coaxial port portion of a coaxial to waveguide adaptor of a device;
guiding the set of electromagnetic waves via a printed circuit board of the device, wherein the printed circuit board comprises a bottom metal layer connected to a bottom portion of an array of metal posts that form a substrate integrated network, and a top metal layer connected to a top portion of the array of metal posts;
transmitting the set of electromagnetic waves by the printed circuit board to a first surface mount coaxial terminal and a second surface mount coaxial terminal, wherein the first surface mount coaxial terminal and the second surface mount coaxial terminal are connected to a first metal post and a second metal post respectively of the array of metal posts; and
emitting at least a subset of electromagnetic waves of the set of electromagnetic waves from the first surface mount coaxial terminal and the second surface mount coaxial terminal, wherein at least the subset of electromagnetic waves represents a differential signal corresponding to an impedance bandwidth, wherein the impedance bandwidth is based on an arrangement of the set of geometric parameters corresponding to components of the device, and wherein the set of geometric parameters are arranged to achieve the impedance bandwidth ranging from about 57.5 gigahertz to about 65.4 gigahertz.

11. The method of claim 10, further comprising adjusting a set of geometric parameters of the device to achieve a target differential signal that corresponds to a target impedance bandwidth.

12. The method of claim 10, wherein the impedance bandwidth has a reflection coefficient of less than or equal to −15 dB.

13. The method of claim 10, wherein the amplitude and the phase imbalance measure less than −0.2 degrees and 5 degrees respectively.

14. The method of claim 10, further comprising converting a single-ended signal to a differential signal by connecting a first differential port of a differential probe to the first surface mount coaxial terminal and a second differential port of the differential probe to the second surface mount coaxial terminal or reverse.

15. The method of claim 10, further comprising connecting the waveguide port portion of the coaxial to waveguide adaptor to a waveguide that conveys the set of electromagnetic waves to a target location.

16. A system, comprising:
a coaxial to waveguide adaptor comprising a coaxial cable port and a waveguide port, wherein the waveguide port guides electromagnetic waves in a first direction or a second direction, wherein the coaxial cable port is configured to connect to a coaxial cable, and wherein the waveguide port is configured to connect to a waveguide;
a substrate integrated waveguide network that transmits the electromagnetic waves, wherein the substrate integrated waveguide network comprises a printed circuit board comprising a bottom metal layer and a top metal layer connected by metal vias, and a rectangular window located on the bottom metal layer, wherein the coaxial to waveguide adaptor is connected to the rectangular window; and
a first coaxial terminal and a second coaxial terminal mounted to the top metal layer, wherein the first coaxial terminal and the second coaxial terminal couple a first set of the electromagnetic waves and a second set of the electromagnetic waves respectively into transformed electromagnetic waves that represent a differential signal.

17. The system of claim 16, wherein the first coaxial terminal and the second coaxial terminal receive the electromagnetic waves from the substrate integrated waveguide network.

18. The system of claim 16, wherein the waveguide port receives the electromagnetic waves, and wherein the electromagnetic waves represent a single-ended signal.

19. The system of claim 16, wherein one or more geometric parameters of the device are adjustable to achieve target transformed electromagnetic waves that correspond to a target bandwidth, a target amplitude, and a target phase imbalance level.

20. The system of claim 16, wherein one or more geometric parameters of the device are adjusted to achieve an impedance bandwidth ranging from about 57.5 gigahertz to about 65.4 gigahertz.

21. The system of claim 16, further comprising a first differential port of a differential probe connected to the first coaxial terminal and a second differential port of the differential probe connected to the second coaxial terminal.

* * * * *